United States Patent [19]

Deierling et al.

[11] Patent Number: 5,111,069

[45] Date of Patent: May 5, 1992

[54] LAYOUT OF INTEGRATED CIRCUIT WITH VERY LARGE TRANSISTORS

[75] Inventors: Kevin E. Deierling; Gary V. Zanders, both of Dallas, Tex.

[73] Assignee: Dallas Semiconductor Corporation, Dallas, Tex.

[21] Appl. No.: 676,133

[22] Filed: Mar. 27, 1991

Related U.S. Application Data

[63] Continuation-in-part of Ser. No. 574,167, Aug. 27, 1990, abandoned.

[51] Int. Cl.⁵ .................... H03K 3/335; H03K 3/353
[52] U.S. Cl. .................... 307/303.2; 307/304; 307/241; 357/42
[58] Field of Search .................... 307/303, 303.2, 304, 307/241, 475; 357/23.1, 23.8, 42, 41

[56] References Cited

U.S. PATENT DOCUMENTS

| | | | |
|---|---|---|---|
| 4,931,844 | 6/1990 | Zommer | 307/242 |
| 5,030,861 | 7/1991 | Hoffman et al. | 307/480 |
| 5,036,215 | 7/1991 | Masleid et al. | 307/303.2 |

Primary Examiner—Stanley D. Miller
Assistant Examiner—Toan Tran
Attorney, Agent, or Firm—Worsham, Forsythe, Sampels & Wooldridge

[57] ABSTRACT

An integrated circuit which provides multiple independently accessible low-on-state-resistance switches, using conventional CMOS technology. Charge pumping is used to boost the gate voltage to lower the on-state resistance. The surface of the chip consists primarily of a few very large path transistors. This chip is perferably combined with a power management chip which provides logic outputs, and the large PMOS switches are used for controlling the power supply to various other chips, such as SRAMs.

100 Claims, 7 Drawing Sheets

LAYOUT OF INTEGRATED CIRCUIT WITH VERY LARGE TRANSISTORS

CROSS-REFERENCE TO OTHER APPLICATIONS

The present application invention is a continuation-in-part application, claiming priority from U.S. patent application Ser. No. 574,167, filed Aug. 27, 1990, now abandoned which is herein incorporated by reference.

BACKGROUND AND SUMMARY OF THE INVENTION

The present invention relates to an integrated circuit which provides improved switching capabilities and full compatibility with the processes normally used for low-power digital circuits.

Conventional Power FET Technologies

The first commonly used "power" semiconductor devices—that is, transistors used to switch currents of an ampere or more—are bipolar transistors. However, the simple biasing characteristics of field effect transistors (FETs) inspired device technologists to look for a way to develop FETs with high current carrying capacity, and such "power" FETs have been commercially available since the late 1970's.

Discrete power FETs, as of 1990, are readily available with continuous current capacities of the order of tens of amperes, rated maximum voltage of a few hundred volts and a price of the order of a few dollars to a few tens of dollars. However, the device technology used for such high-current FET devices is very different from that used for conventional digital or analogue integrated circuits. These high-powered devices will commonly use a vertical current flow arrangements, so that the primary direction of current flow is normal to the surface of the integrated circuit. By contrast, in all standard high density integrated circuit architectures, the current flow of an FET is lateral. Typically, the source and drain region will be shallow diffusions at the surface of the silicon, and current will flow horizontally from the source to the drain (parallel with the surface plane of the silicon).

Another family of technologies which have also been referred to as power technologies are high voltage technologies, such as the "bidFET" from Texas Instruments. These device technologies are somewhat more compatible with standard CMOS technology, but still require nonstandard processing steps. Moreover, these technologies are directed to high voltage handling capability rather than high current handling capability. Thus, while such device technologies can be very useful for applications such as display drivers, where high voltages must be handled, they have no inherent advantage at providing the low on-state resistance needed for high-current capability.

There have been proposals to provide technologies which combine digital logic with high-current switching capability. Such technologies have been promoted under the buzzword of "smart power" technologies. However, while sound arguments have been made that there is a commerical need for such products, no such products have been widely successful for high-current applications. This is probably because of the difficulty of integrating power FET technologies with conventional CMOS logic technology.

High-Current Switches in Conventional FET Technology

Many CMOS integrated circuits will include one or two large driver transistors. For example, the battery management integrated circuits sold by Dallas Semiconductor have large PMOS transistors which are used to connect or disconnect a battery input or a system power supply input to a power output (which is used to power up other integrated circuits, such as SRAM's). In a 1.2 micron process, where the minimum length of a transistor's channel is 1.2 microns and the minimum width of the transistor channel is only slightly more (e.g. 1.5 microns), a simple logic gate, such as might be used for buffering or for an AND-gate, would typically have W/L dimensions of 2/1.2. If more drive capability is needed—for example, for a transistor which must produce a rapid slew of a capacitive load, or a transistor which must drive a line which runs all over the chip, or (even more) for a transistor which must drive a signal onto an output pad of the chip—a larger width will be used, while maintaining the minimum length. An extreme example of this would be the power-supply-switching transistors used in Dallas Semiconductor parts, which commonly have W/L dimensions of 30,000/1.2 or even 50,000/1.2.

In conventional single-poly CMOS processes, a transistor exists wherever a strip in the polysilicon layer runs across a strip of the active region[1]. See *Mead and Conway, Introduction to VLSI Systems*, which is herein incorporated by reference. The geometry of this transistor is defined simply by the widths of the crossing stripes. Thus, to increase the width of the transistor, the width of the active area crossed by the polysilicon is increased. If you increase the length of the transistor, the width of the polysilicon stripe, where it crosses the active area, is increased.

[1] The "active region" is a region where the crystalline silicon substrate is not covered by thick-field oxide.

However, this geometry is not quite so simple where extremely large transistors are being constructed. For one thing, 50,000 microns is equal to 50 mm, or two full inches. Such a length in a straight line would not fit in a normal integrated circuit. Therefore, such large transistors are normally laid out in a repetitive folded pattern, to achieve the needed total effective gate width. Thus, such a transistor might appear from above as a regular array of stripes, connected so that the effective pattern is: source/gate/drain/gate/source/gate/drain etc. Secondly, the source and drain diffusions have a significant sheet resistance, which will show up as a series resistance if current is forced to run for very long distances in the source and drain regions. (However, this series resistance is typically shunted by multiple contacts to a metal line.)

In many integrated circuits which perform power switching functions, a certain amount of current-carrying capability is provided on-chip, and a logic signal output is also provided to permit additional drivers to be operated off-chip. For example, the DS1236 MicroManager ™ not only includes a connection to a VCCO power output, as discussed above, but also includes a logic signal (referred to as "PF" in the following description) which can be used to control an external switch.

Such levels can be used to control discrete power FETs if desired. However, the cost of discrete power FETs can be relatively high, particularly for those which can be controlled directly by the logic levels normally provided by a CMOS logic output.

The present invention provides an integrated circuit which uses conventional CMOS technology to provide a chip whose area is dominated by switch transistors. The device technology actually used for the switch is not significantly different from that normally used for high-current switches on CMOS integrated circuits. However, this integrated circuit differs in that it is nearly all switching device.

FIG. 7 shows the general structure of the principal preferred embodiment. While the features of this specific embodiment are not by any means all necessary to practice the invention, they do give some idea of the proportions used. The large regular arrays in the four corners of the chip, and in the center of the chip, are all switches. Thus, it may be seen that the total area of this chip is dominated by these five large transistors. Moreover, it may be seen that the area devoted to these transistors is more than ten times the area devoted to any digital logic on-chip.

More precisely: each of the five large transistors, in the presently preferred embodiment, includes a folded active area which is about 9% of the total area of the chip (45% of total area for active areas of all large transistors). If the metal connections to the source/drain areas are included, the switching transistors cover about 65% of total chip area. If we consider that an additional percentage of total area is unusable (because it falls too near the edge), it may be seen that this is a very large fraction of total area.

Switching Between Power Supply Inputs

Semiconductor integrated circuits require power supplies which provide power within a narrow range of voltages. For example, current-generation CMOS integrated circuits typically require power be delivered at a voltage between 4.5 and 6 volts. When the power supply moves out of the prescribed voltage range, then the integrated circuit will not perform as advertised. For example, dynamic memories may lose data. Alternatively, the integrated circuit may have internal or external circuitry that switches in a backup power supply such as a battery. However, to provide the possibility of switching to a backup power supply, the power supply must be connected to the integrated circuit through a switch, and any switch will insert some impedance and consequent voltage drop. Indeed, a typical integrated circuit power switch is a p-channel field effect transistor with a large gate width to length ratio, and an on impedance of 1 ohm may be significant. For example, a 1 Mb SRAM will typically draw up to about 75 mA while switching, so an array of four SRAMs supplied through a single 1 ohm switch may face a supply voltage drop of 0.3 volts. And such voltage drops are especially troublesome during battery backup operation due to battery voltage and energy limitations.

The direct approach of simply increasing the width to length ratio is not practical, in that the chip area occupied by the switch becomes enormous as the gate width is increased and the chip yield goes down as the gate length is decreased.

Charge-Pumping to Provide Increased Drive Capability from a FET Transistor

A technique which has long been used in semiconductor dynamic random access memories (DRAMs) is to reduce the on-state resistance of a transistor by driving its gate to a more extreme voltage than will be needed to reach the ON state. This is commonly done in the wordlines of a DRAM cell subarray: the wordlines in a subarray are long polysilicon lines, which are connected to act as the gates for a number of memory cells (e.g., 256 or more) in a single row. The pass transistor in each memory cell is an N-channel FET. When it is desired to turn on the pass transistors for the cells in a single row, the voltage applied to the appropriate word line is boosted above the normal supply voltage. For instance, in a conventional 5-volt DRAM part, the voltage applied on the word line may be boosted to six or seven volts. This boosted voltage lowers the on-state resistance of each of the accessed pass transistors, and thereby lowers the RC time constant of the summation of cell-capacitor plus pass transistor plus column line. Thus, faster sensing and refresh operations can be achieved.

The presently preferred embodiment uses voltage boosting (by charge pumping circuits) to increase the productivity of P-channel large pass transistors. In the presently preferred embodiment, each of the five large transistors shown in FIG. 7 has voltage boosting used to reduce its gate voltage below ground. (For PMOS transistors, the transistor turns on increasingly hard as the gate voltage is lowered. Thus, while an N-channel can be regarded as fully turned on at 5 Volts, its conductivity will be considerably higher if a gate voltage of 7 Volts is applied. Similarly, a PMOS device can be regarded on ON at 1 V or at 0 V, but will be even more conductive at a gate voltage of −2 V.

Normally, an N-channel transistor will start to turn on when its gate voltage exceeds the ground voltage by a process-dependent "threshold voltage" referred to as $V_T$ or $V_{TN}$. This voltage will typically be in the range of 1.5 to 2 volts for normal CMOS processes. As voltage increases above that point, the transistor's conductance will continue to rise.[2] Thus, an N-channel field-effect transistor (NFET), for simple digital circuit analysis, can usually be regarded as being "on" whenever its gate voltage is greater than 2.5 volts, and fully on when its gate voltage becomes close to the $V_{DD}$ supply voltage of five volts. Similarly, for crude first-order circuit analysis, a PFET can usually be regarded as being on whenever its gate voltage drops below 2.5 volts, and fully on whenever its gate voltage becomes close to the lower supply voltage $V_{SS}$ of zero volts. However, the productivity of the NFET can be further increased if its gate voltage is increased above five volts, and the conductivity of the PFET can be further increased if its gate voltage is lower than below zero volts.

[2]This rise can usually be regarded as approximately linear, in the range of voltages of interest for digital ICs. See, for example, Sze, "physics of Semiconductor Devices", (2nd edition, 1981). In addition, there will be some dependence of this behavior on the applied voltage between the drain and the source. There will also be some dependence on other secondary effects, such as "body effect" which has been extensively discussed in the literature and are not particularly relevant here.

These voltages are outside the normal range of supply voltages. Therefore, to achieve such voltages on-chip, a charge-pumping circuitry is used. A variety of circuits for this purpose have been proposed.

The integrated circuit of the presently preferred embodiment provides large P-channel FETs for power switching. P-channel FETs are normally used for power switching, because the use of an N-channel FET would impose a drop of $V_{TN}$ across the transistor, which would be unacceptable.

The integrated circuit of the presently preferred embodiment is particularly advantageous in combination with other integrated circuits for performing power management. This integrated circuit provides greatly increased switching capability, including an on-state conductivity of 10s of mhos or better.

The presently preferred embodiment, which is now (1991) in production, is specified at a drive current capability of 300 mA per transistor with a voltage drop of no more than 200 mV. This implies a rated drive current of 1.5 Amperes for the whole chip, and an on-state resistance of less than 0.13 Ohms (i.e. on-state conductance greater than 7.5 Siemens total, and greater than 1.5 Siemens per transistor). However, actual measurements of manufactured devices have indicated that this specification is quite conservative, and the actual measured on-state resistances are consistently somewhat lower.

Note that locating large pass transistors in each of the corners of the chip is particularly advantageous, because the bond pads for source and drain connections to each of these transistors can be connected very directly to the source and drain terminals. Thus, series resistance is not added by unnecessary metal lines.

BRIEF DESCRIPTION OF THE DRAWING

The present invention will be described with reference to the accompanying drawings, which show important sample embodiments of the invention and which are incorporated in the specification hereof by reference, wherein:

FIGS. 3, 4a-1, 4a-2,5 and 6 are further schematic diagrams of the first preferred embodiment

DESCRIPTION OF THE PREFERRED EMBODIMENTS

The numerous innovative teachings of the present application will be described with particular reference to the presently preferred embodiment, wherein these innovative teachings are advantageously applied to the particular problems of power-switching in battery-backed systems. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
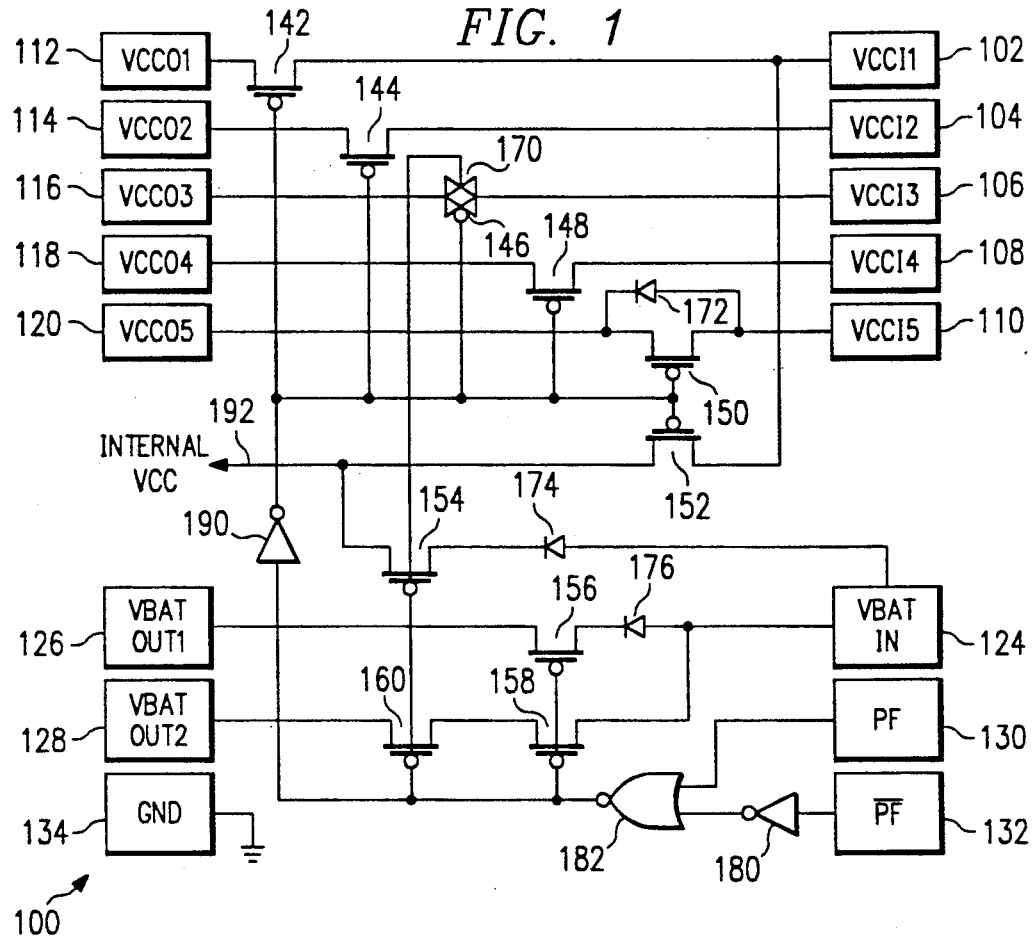
FIG. 1 is a schematic diagram of a first preferred embodiment switch.

First preferred embodiment switch, generally denoted by reference numeral 100, is illustrated in schematic view in FIG. 1 and essentially consists of five off-on power switches in parallel plus a complementary activated off-on switch for a backup power supply. Switch 100 includes five power input pads 102, 104, 106, 108, and 110 and five corresponding power output pads 112, 114, 116, 118, and 120, respectively; battery power input pad 124 and battery power output pads 126 and 128; power failure signal (PF) input pad 130 and Not PF pad 132; ground pad 134; p-channel FETs 142, 144, 146, 148, 150, 152, 154, 156, 158, and 160; n-channel FET 170; diodes 172, 174, and 176; Schmitt triggered inverter 180; NOR gate 182; and charge pumped inverter 190. These devices are powered from internal node 192 which is either connected to external power at pad 102 or to backup power external power at pad 124. Note that the pads are also mnemonically labelled for use in a CMOS circuit; for example the first Vcc input pad 102 is labelled Vcci1 and the first Vcc output pad 112 is labelled Vcco1. FETs 146 and 170 form a transmission gate, that is the p-channel and n-channel FETs are in parallel between pads 106 and 116. P-channel FETs 142, 144, 146, 148, and 150 have have polysilicon gates with widths of 90,000 microns (micrometers) and lengths of 1.2 microns on a gate oxide of 225 Angstrom thickness over an N well in an N-type silicon substrate. P-channel FETs 152, 154, 156, 158, and 160 are similar but with gate widths of 2,000 microns. N-channel FET 170 also has a polysilicon gate but with a width of 400 microns and length of 1.2 microns on a gate oxide over a P well in the N-type silicon substrate.

Switch 100 operates as follows: Under typical operating conditions an external power supply is connected to one or more of input pads 102, 104, 106, 108, and 110 and the PF signal provided to pad 130 is low and the PF\(NOT PF) signal high as long as the external power supply retains its voltage in the range of 4.5 to 6.0 volts. PF and PF\ are TTL compatible so a low is less than or equal to 0.8 volts and a high is greater than or equal to 2.0 volts. If the external power supply voltage moves out of this range, then an external circuit drives the PF signal high; see FIG. 2 and the related description. With PF low and PF\ high the input to NOR gate 182 consists of two lows, and the output of NOR gate 182 is high and fed into inverter/charge pump 190. With a high input inverter/charge pump 190 outputs about −5 volts and p-channel FETs 142, 144, 146, 148, and 150 are turned on to pass the external power through to the corresponding one or more output pads 112, 114, 116, 118, and 120. P-channel FET 152 is also turned on to provide power from input pad 102 to internal node 192.

The high output of NOR gate 182 also turns off p-channel FETs 154, 156, 158, and 160 and turns on n-channel FET 170. Thus battery input pad 124 is isolated from battery output pads 126 and 128 and also from internal node 192.

If the external power supply voltage moves outside of the 4.5 to 6.0 volt range, then external detectors drive the PF signal high (and PF\ low) and thus the output of NOR gate 182 is low and the output of inverter/charge pump 190 is high. This turns off p-channel FETs 142, 144, 146, 148, 150, and 152 and n-channel FET 170 which isolates the output pads 112, 114, 116, 118, and 120 from input pads 102, 104, 106, 108, and 110; but this also turns on p-channel FETs 154, 156, 158, and 160 which connects input pad 124 to output pads 126 and 128 for backup power supply and also backup power for internal use at node 192.

Diode 172 allows input 110 to be alternately used as a large battery source with a built-in protection diode. Diodes 174 and 176 provide protection against sourcing current into an external battery.

Figure 2:
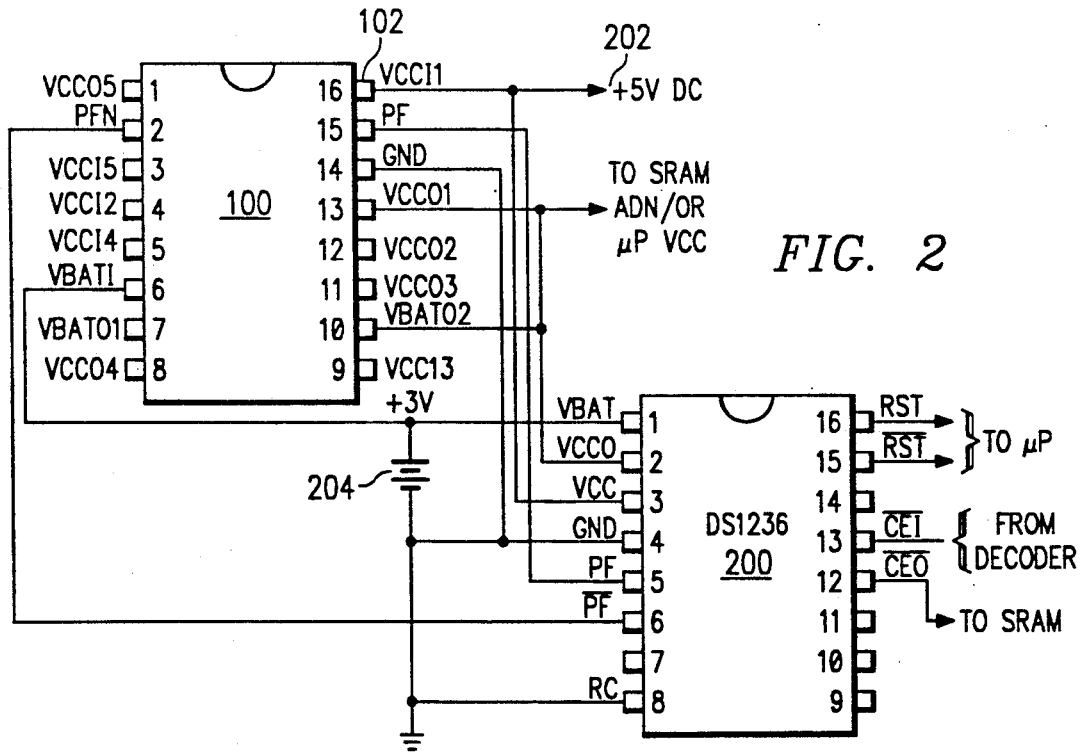
FIG. 2 shows an application of the first preferred embodiment.

FIG. 2 illustrates first embodiment switch 100 connected with a microprocessor manager 200 to supply power with a battery backup. Manager 200 may be a standard part such as the DS1236 manufactured by Dallas Semiconductor Corporation. Manager 200 includes circuitry to sense the external power supply 202 voltage and generate the PF and PF\ signals that activate switch 100. In the arrangement illustrated in FIG.

2 the backup battery 204 supplies only 3 volts, so the PF signal may preferably be generated only after the external power 202 drops to about 3 volts.

Figure 3:
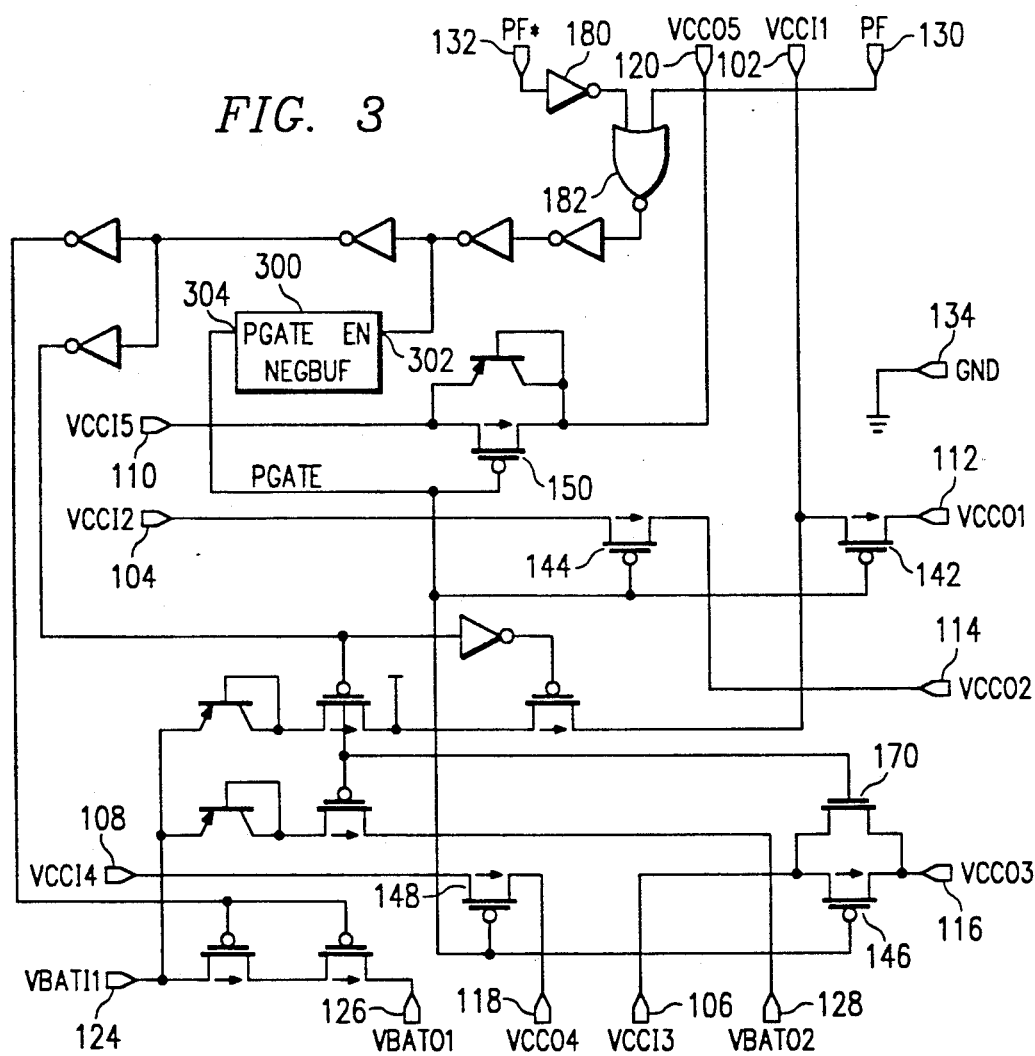

FIGS. 3-6 are further schematic views of the first preferred embodiment switch illustrating more detail of the circuitry. In particular, FIG. 3 shows the diodes 172, 174, and 176 as diode connected pnp bipolar transistors and that the output of NOR gate 182 is simply buffered and appropriately inverted to drive p-channel FETs 154, 156, 158, and 160 in the backup power supply circuitry; whereas the output of NOR gate 182 when high enables negative buffer 300 (at input 302) which outputs (at output 304) −5 volts to drive the gates of p-channel FETs 142, 144, 146, 148, 150, and 152 to −5 volts rather than just the usual 0 volt low drive. This negative drive of the p-channel gates provides a significantly lower on resistance of the p-channel FETs. Indeed, for a small source to drain voltage (Vds) drop the conductance of a p-channel FET is approximately $(\frac{1}{2})m(W/L)C(Vgs-Vt)$ where m is the hole surface mobility, W is the gate width, L is the gate length, C is the gate capacitance per unit area, Vgs is the gate to source voltage, and Vt is the threshold voltage.

A twin well CMOS device typically has a p type well held at ground Vss (or pumped to 2 or 3 volts below ground to Vee), and n well held at Vdd (+5 volts), and p-channel FETs with threshold voltages of about −1 volt. Thus with a low signal (0 volts) applied to the gate of a typical p-channel FET, (Vgs-Vt) equals about −4 volts for small Vds. In contrast, FETs 142, 144, 146, 148, and 150 have (Vgs-Vt) equal to about −9 volts when driven by negative buffer 300; and this implies a channel conductance increase of 125%.

FIG. 3 also indicates the sizes of the various devices.

Figure 4B:
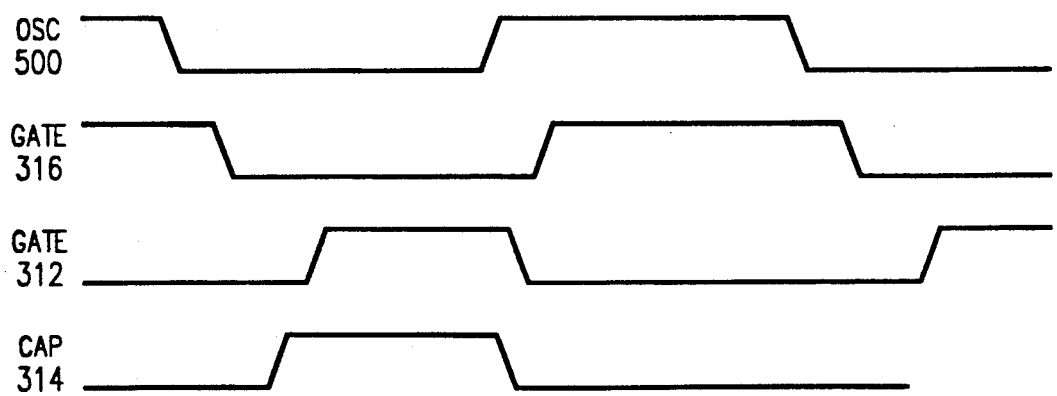
FIG. 4b is a timing diagram.
Figures 1, 4A:
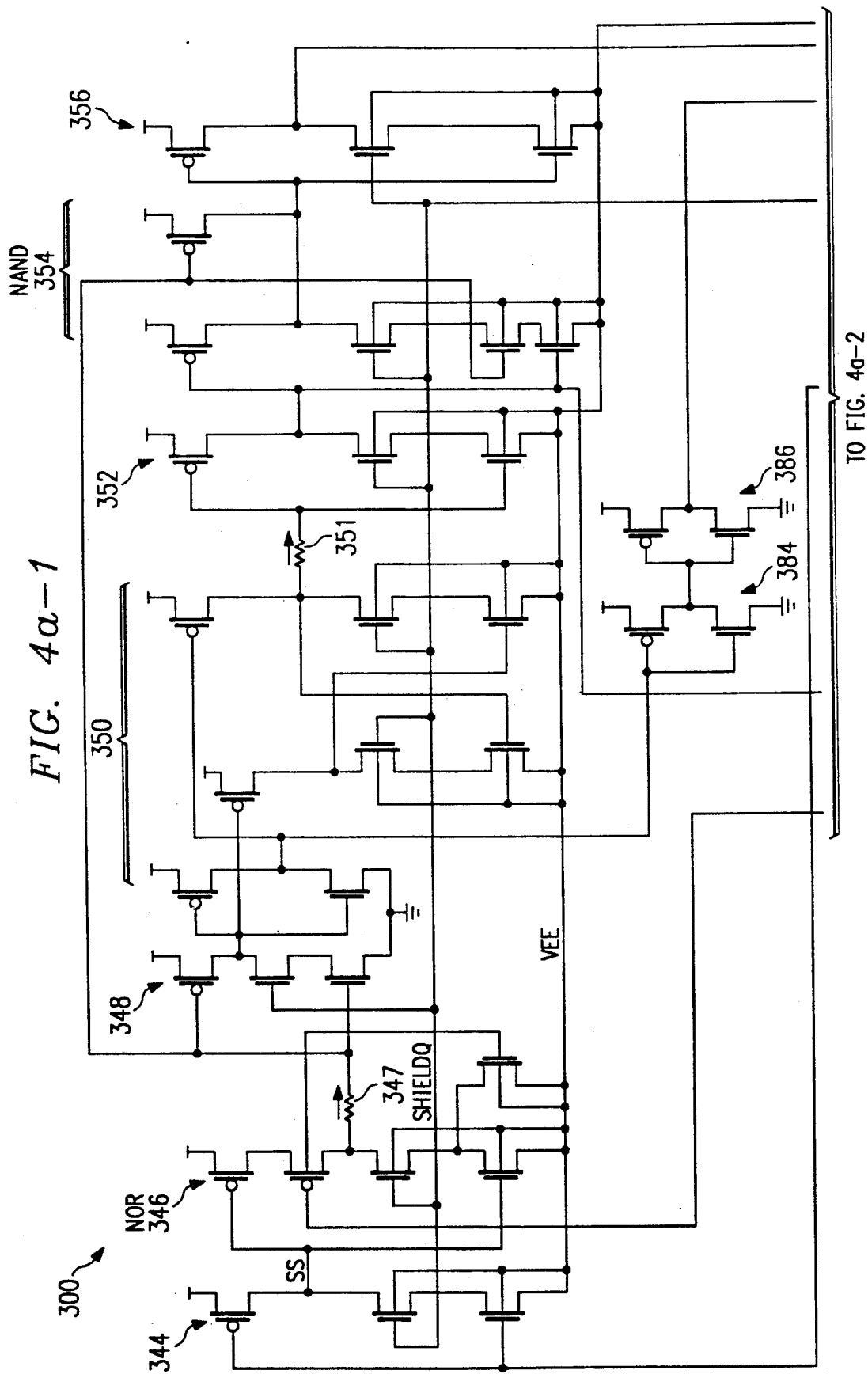
Figures 2, 4A:
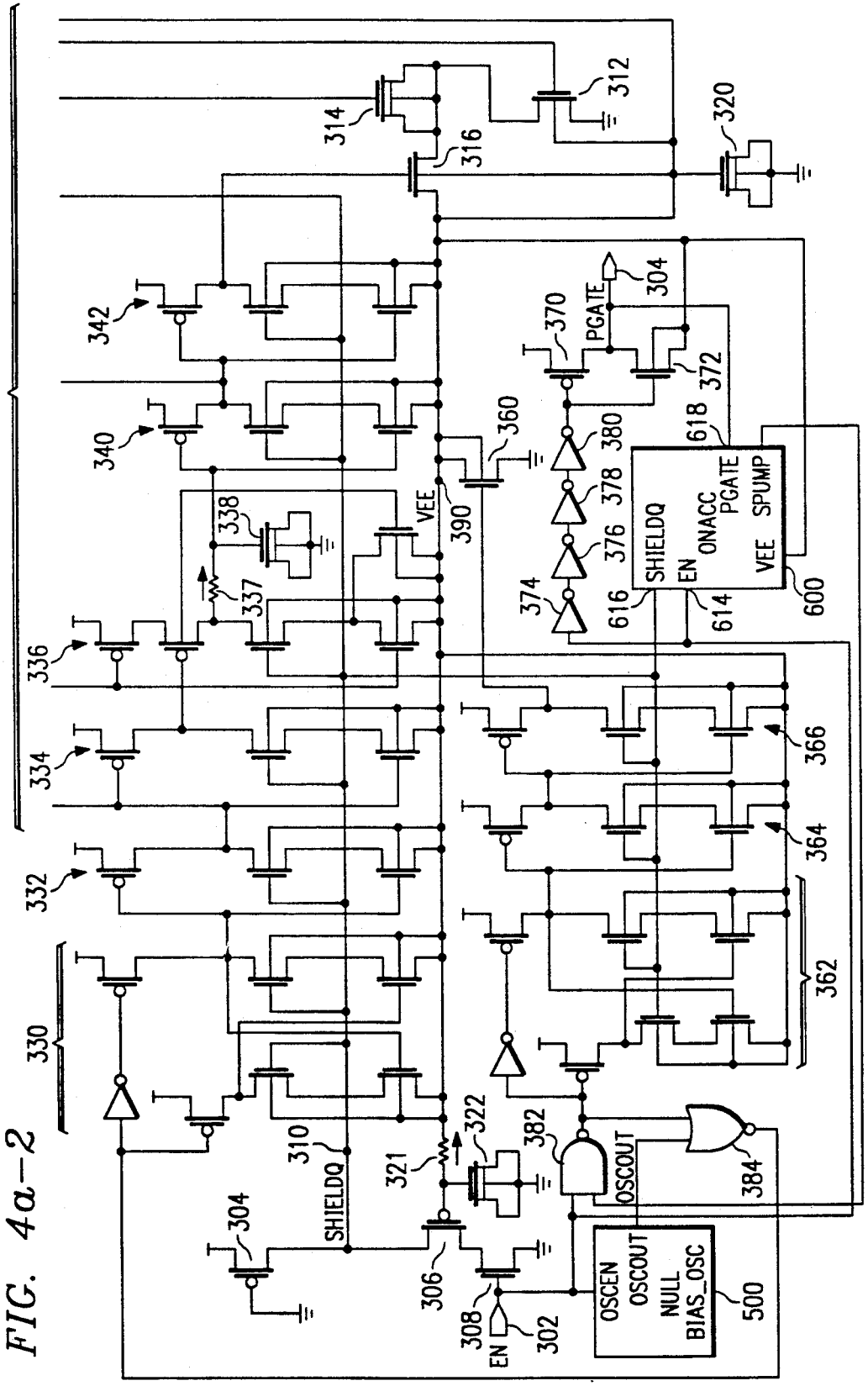

FIG. 4a schematically illustrates negative buffer 300 which includes oscillator 500 (schematic in FIG. 5); a bias circuit formed by two long channel p-channel FETs 304 and 306 and n-channel FET 308 to generate a bias voltage on node 310 of about Vdd/2; a charge pump formed by n-channel FETs 312 and 316 plus floating capacitor 314 and grounded capacitor 320; timing circuitry used with the output of oscillator 500 to operate the charge pump including buffer 330, inverters 332 and 334, NOR gate 336, resistor 337 with capacitor 338, inverters 340, 342, and 344, NOR gate 346, inverter 348, buffer 350, inverter 352, NAND gate 354, and inverter 356; substrate pump discharge FET 360 and drive circuitry including buffer 362 and inverters 364 and 366; p-channel gate bias FETs 370 and 372 and drive inverters 374, 376, 378, and 380; NAND gate 382 and NOR gate 384; and accelerator 600 (schematic in FIG. 6).

Note that most of the buffers, inverters, and gates are modified by inclusion of a second series n-channel FET with its gate biased by the voltage on node 310 and also with the source of the first n-channel FET plus the substrate for both n-channel FETs pumped down to about −5 volts (at node 390). This second n-channel FET provides protection against hot electron injection.

The operation of the charge pump to drive node 390 to about −5 volts is illustrated in the timing diagram of FIG. 4b. The first trace shows the output of oscillator 500 after it has passed through gate 384, and this output then passes through buffer 330 and inverter 332 where it splits with one branch going to NOR gate 346 and the other branch going to NOR gate 336. The output of NOR gate 336 passes through RC delay made of resistor 337 and capacitor 338 (R is 11K ohms and C is 3.8 pF) and into inverter 340 where it splits with one branch going to inverter 344 then NOR gate 346 and the other passing through inverter 342 to drive the gate of n-channel FET 316. A low gate voltage on FET 316 turns it off and isolates node 390; whereas, a high gate voltage connects node 390 to the substrate plate of capacitor 314. The signal on the gate of FET 316 is shown as the second trace in FIG. 4b. The output of NOR gate 346 splits with one branch going to NAND gate 354 and the other passing through 11K ohm resistor 347 (which generates an RC delay in view of the gate capacitances), inverter 348, buffer 350, 11K ohm resistor 351, inverter 352, NAND gate 354, and inverter 356 to drive the gate of n-channel FET 312. The third trace of FIG. 4b shows the gate voltage of FET 312. When the gate voltage of FET 312 is high, FET 312 connects the substrate plate of capacitor 314 to ground, and a low gate voltage isolates the plate. Because the signals applied to the gates of FETs 312 and 316 have no high overlap the substrate plate of capacitor 314 alternates between being grounded and being connected to node 390 with a short period of floating between these connections. Lastly, the fourth trace of FIG. 4b shows a signal taken out of buffer 350 and passed through inverters 384 and 386 to drive the gate plate of capacitor 314. As shown in FIG. 4b, the gate plate of capacitor 314 is driven high (+5 volts) just after the substrate plate has been disconnected from node 390, and then the substrate plate is grounded. The +5 volts on the gate plate and the ground on the substrate plate are held for about 80 nsec to allow capacitor 314 to fully charge up (the RC time constant is roughly 40 nsec for the device sizes shown in FIG. 4a). After capacitor is charged up, FET 312 is turned off to isolate the substrate plate from ground and the gate plate is driven low (0 volts). Thus the now-floating substrate plate drops to −5 volts. Next, FET 316 reconnects the substrate plate to node 390, and this pulls node 390 down towards −5 volts, depending upon the node capacitance and potential. Repeating this cycle pumps node 390 towards −5 volts with the equilibrium potential determined by factors such as pumping rate, leakage currents, and so forth.

Lastly, terminal 304 is connected to node 390 by n-channel FET 372, and this provides the negative bias for the gates of the p-channel power switch FETs 142, 144, 146, 148, and 150.

In the event of a power supply failure so switch 100 input 130 receives a high PF signal, enable input 302 for negative buffer 300 goes low and the charge pump is shut down by oscillator 500 deactivation, node 390 is brought to ground by FET 360, and the p-channel bias at terminal 304 is brought up to Vdd (and thereby turn off the p-channel power switch FETs) by FET 370.

Figure 5:
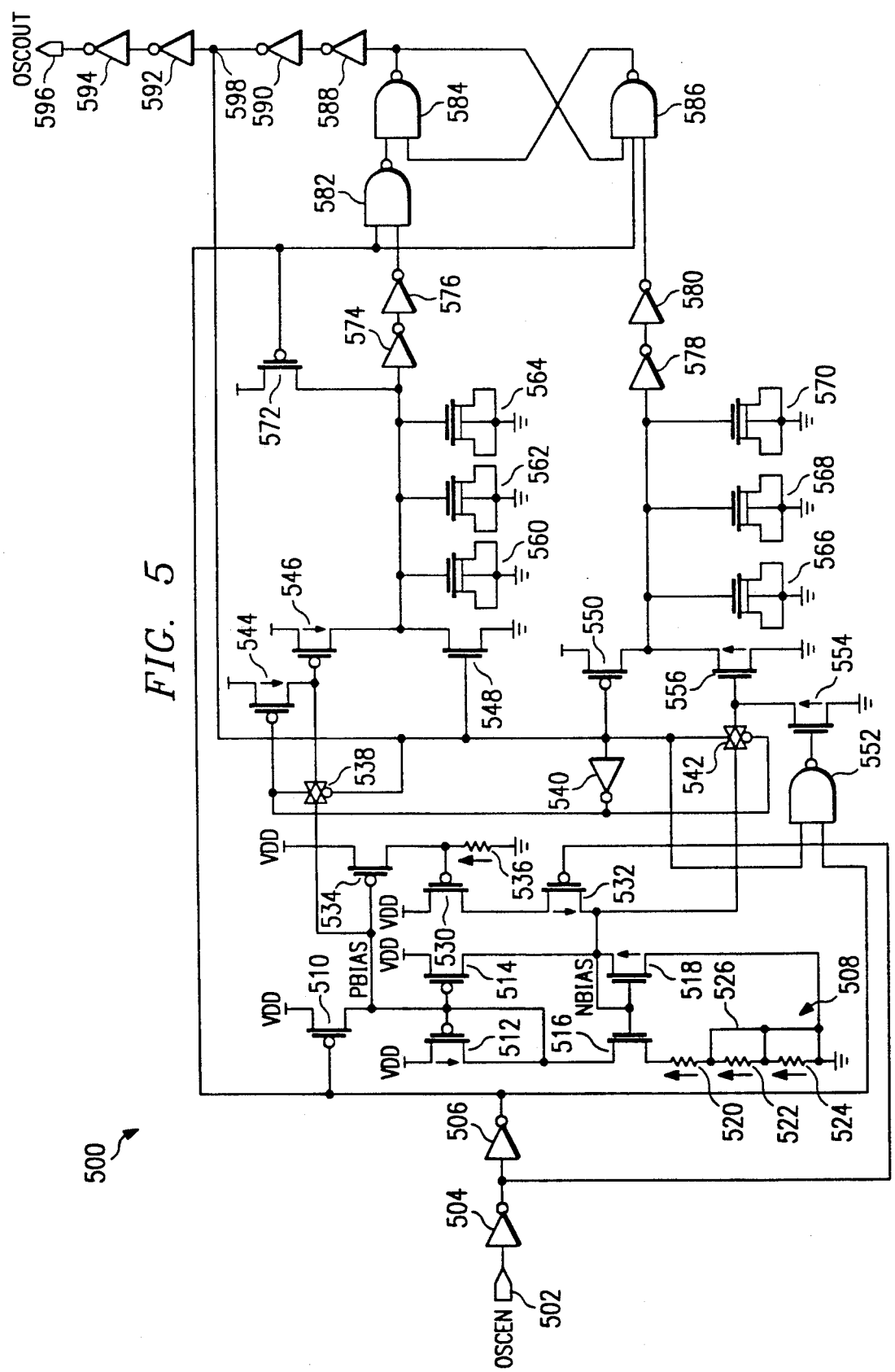

FIG. 5 schematically illustrates oscillator 500 which includes enable input 502; inverters 504 and 506; Wilson current mirror made of p-channel FETs 512 and 514, n-channel FETs 516 and 518, and bias resistors 520, 522, and 524 (the series resistance can be adjusted with strap 526 to short out either 522 or 524 or both); FET 510 which can disable the current mirror; a two branch feedback loop made of a latch formed from NAND gates 584 and 586, inverters 588 and 590, upper branch inverter made of FETs 546 and 548, parallel capacitors 560, 562, and 564, inverters 574 and 576, NAND gate 582, lower branch inverter made of FETs 550 and 556, parallel capacitors 566, 568, and 570, and inverters 578 and 580; and output inverters 592 and 594 plus output terminal 596.

Oscillator 500 operates as a Delta Vt current source based oscillator as follows: First consider the case with the enable input high, then inverter 504 supplies a low to turn on FET 532, and inverter 506 supplies a high to turn off FETs 510 and 572 and render NAND gates 552 and 582 effectively inverters and three input NAND gate 586 effectively a two input NAND gate. With FET 510 off Wilson current mirror 508 provides a p bias at the gate of FETs 512 and 514 of about 4 volts and an n bias at the gates of FETS 516 and 518 of about 1 volt; these biases will be used to control the current for charging and discharging the capacitors. If 526 is removed to insert resistors 522 and 524 with resistor 520, then the biases change. Of course, if just one of resistors 522 and 524 is inserted, the the biases will take on intermediate values.

The feedback loop in oscillator 500 is from node 598 through two parallel paths (the upper branch of FETs 544, 546, and 548 followed by capacitors 560, 562, and 564 and then three inverters 574, 576, 582 (NAND gate with one fixed high input; and lower branch of FETs 550, 554, and 556 followed by capacitors 566, 568, and 570 and then two inverters 568 and 580) into the latch formed by cross coupled NAND gates 584 and 586, and lastly two more inverters 588 and 590 back to node 598. Thus the loop has an odd number of inversions and will oscillate; the time constant is essentially determined by the rate of charging of capacitors 560, 562, and 564 through FET 546 when biased by the p bias from current mirror 580 and the rate of discharging of capacitors 566, 568, and 570 through FET 556 when biased by n bias from current mirror 580.

In more detail, the oscillation may be seen as follows: If node 598 has just switched from low to high, then the feedback turns one FET 548 to quickly discharge upper branch capacitors 560, 562, and 564 to ground, turns off transmission gate 538 to isolate the p bias from the gate of FET 546 and turns on FET 544 to precharge the gate of FET 546 to Vdd, turns off FET 550 to isolate lower branch capacitors 566, 568, 570 from Vdd, turns off FET 554 (in conjunction with the high enable signal on NAND gate 552) to isolate the gate of FET 556 from ground, and turns on transmission gate 542 to apply the n bias to the gate of FET 556. Thus the lower branch capacitors begin discharging from Vdd through FET 556 with a current determined by the n bias generated by current mirror 580. As the lower branch capacitors are discharging the upper branch capacitors are effectively at ground, so the upper branch's input to NAND gate 584 is high and the lower branch's input to NAND gate 586 remains high until inverter 578 is switched low. Thus the latch output is high and node 598 remains high until inverter 578 is switched. Once inverter 578 goes low, this ripplies through to drive node 598 low which turns off FET 548 to isolate the upper branch capcitors from ground, turns off FET 544 to isolate the gate of FET 546 from Vdd and turns on transmission gate 538 to apply the p bias from current mirror 580 to the gate of FET 546 to begin charging the upper branch capacitors from ground through FET 546 with a current determined by the n bias, turns on FET 550 to quickly charge up the lower branch capacitors to Vdd, turns off transmission gate 542 to isolate the gate of FET 556 from the n bias and turns on FET 554 to discharge the gate of FET 556. Again, node 598 remains unchanged until the upper branch capacitors are sufficiently charged to switch inverter 574. Consequently, the duration of the oscillator output highs and lows are independently determined by the upper and lower branch charge and discharge rates.

FET 530 has a high channel resistance (long channel) and operates as a startup circuit for the current source which otherwise has a stable zero curent state.

Contrarily, a low enable input at terminal 502 turns on FET 510 to effectively disable current mirror 580, turn on FET 572 to hold the upper branch capacitors at Vdd, and turn on (through NAND gate 552) FET 554 which turns on FET 556 to hold the lower branch capacitors at ground. Thus node 598 is held high.

Figure 6:
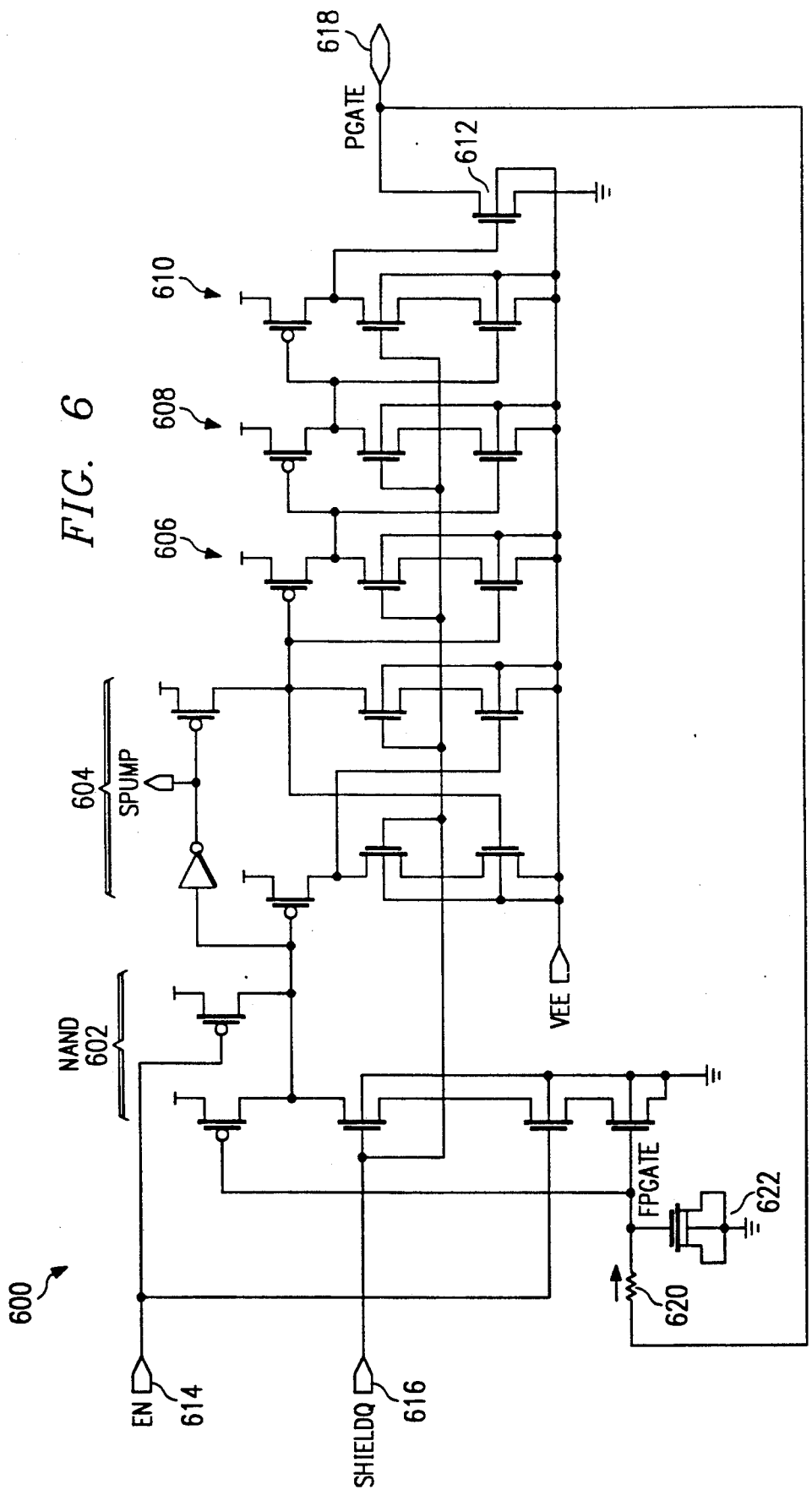

FIG. 6 schematically shows accelerator 600 which includes NAND gate 602, buffer 604, inverters 606, 608, and 610, n-channel FET 612, 6.6K ohm resistor 620 and capacitor 622. As before, the gates and inverters are modified to include an extra series n-channel FET biased by node 310 (about Vdd/2) and the substrate for the n-channel FETs is pumped to $-5$ volts. Accelerator 600 helps rapid discharge of the gates of p-channel power FETs 142, 144, 146, 148, and 150 from $+5$ volts (or whatever the backup power supply provides) to ground through FET 612 as is needed when switch 100 is switching from backup power at input 124 to the external power supply at one of inputs 102, 104, 106, 108, and 110. Indeed, FET 612 is turned on only when both the enable signal from input 302 via input 614 and the p-channel gate bias 304 via input 618 are both high; that is, when the enable for power FET operation is high but the power FET gates are still biased high. Of course, the charge pump is activated by the enable signal at 302 going high, and the previously described pumping of the power FET gates to $-5$ volts is beginning.

Figure 7:
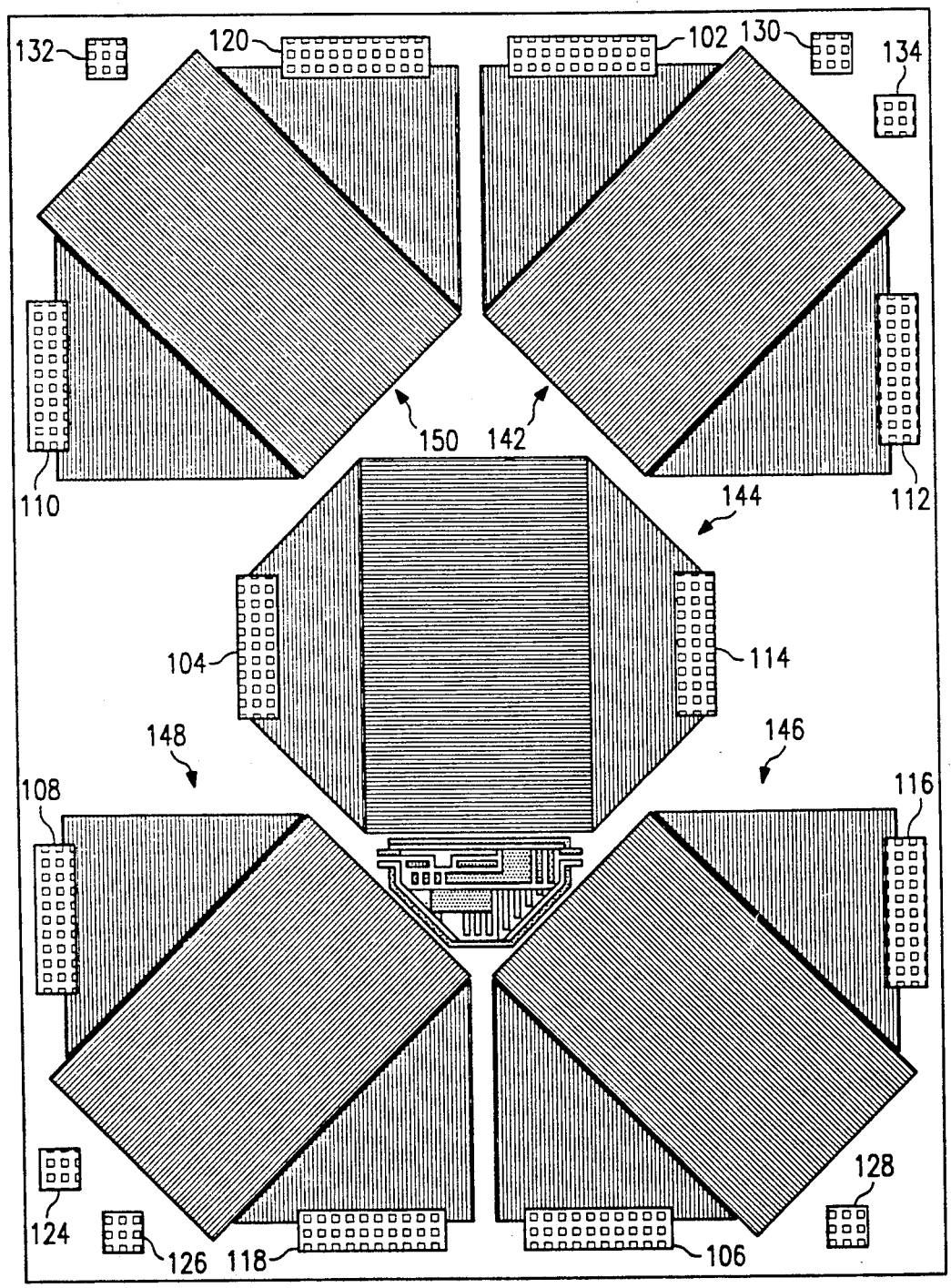
FIG. 7 is a layout of the metal level of the first preferred embodiment.

FIG. 7 is a layout of the metal level of the first preferred embodiment switch 100 and illustrates the large size of the power FETs and small portion required by the remainder of the circuitry. Switch 100 is made with a twin well CMOS process using an n-type substrate. The substrate is tied to Vcc internal while the p wells are tied to ground or Vee.

Driving p-channel FET gates below the usual low in order to increase channel conductivity is essentially a trade-off of achieving smaller power FETs but incorporating pumping and control circuitry and higher stress gate insulators. In particular, pumping the gates to $-2$ volts would only increase conductivity by about 50%, so pumping to large values is desirable. Note that using a p-channel power switch avoids the Vt drop that an n-channel power switch would have if only the usual high and low gate biases were used, and thus the pumping of the p-channel gate in power switch 100 is a quantitative and not qualitative change.

A second preferred embodiment provides a switch which is similar to the first preferred embodiment, but the substrate is not pumped, the switching FETs are n-channel, the gates are pumped to Vdd+5 volts, the charge pump has push-pull injectors, the oscillator is a simple ring oscillator with no resistors and with frequency set by the number of stages, and the power fail signal (PF) is generated within the switch by adding voltage detection circuitry.

A third preferred embodiment provides a switch which is similar to the first preferred embodiment but uses a multistage charge pump to pump the gates to $-10$ volts, and includes dual-gate n-channel FETs.

Optimization of Device Geometries

Consider what the sources of series resistance will be in a structure like that of FIG. 7. One will be the transistor channel; one will be series resistance due to lateral current flow in the P+ source/drain regions; one will be contact (resistance at the contacts to the P+ source/drain regions); and one will be series resistance due to lateral current flow in the metal layer. These resistances can be modelling as occurring in series, so the overall voltage drop can be expressed as a sum:

$$V_{TOTAL} = V_{METAL} + V_{ACT+CONT} + V_{CH}.$$

The following calculations will address the problem of reducing the value of $V_{TOTAL}$.

As discussed above, the overall transistor structure resembles a series of parallel stripes, connected to operate as S/G/D/G/S/G/D/G/ etc. One source (or drain) stripe may be regarded as one "leg" of the transistor structure. Each leg includes not only a stripe of P+ active area (the actual source or drain region), but also an overlying stripe of metal, which is connects, through wider metal, to a contact pad. The overlying metal stripe, which has a much lower sheet resistance than the P+ source/drain area, is connected to the source/drain area by many contacts.

The voltage drop in each metal stripe will first be analyzed. If the width (across the direction of current flow) of the adjacent channel is W, and the width of each metal stripe is L1, then the current density in the metal stripe will vary linearly across the width of the transistor channel. If we represent the current at the beginning of the metal leg as $i_L$, then the current varies linearly along the leg (since the source/drain, which shunts the metal leg all along is length, acts as a distributed current sink):

$$i(x)|_{x=0} = i_L$$

$$i(x)|_{x=w} = 0$$

$$i(x) = i_L \left(1 - \frac{x}{w}\right)$$

The resistance of the Metal (neglecting high current phonon scattering) is $$dr = R_S \frac{dx}{L_1}$$

where $R_s$ is the sheet resistance of the metal layer; for example, in the process used to manufacture the presently preferred embodiment, $R_s = 0.100 \, \Omega/\square$.

Thus the incremental voltage drop across a single leg is $$dv = i(x) R_S \frac{dx}{L_1}$$

$$V_L = \int_{x=w}^{x=0} R_S \frac{dx}{L_1} i_L \left(1 - \frac{x}{w}\right)$$

-continued $$\frac{R_S}{L_1} i_L \left( \left(x - \frac{x^2}{2w}\right); 0 \right) = \frac{R_S i_L}{L_1} \left[ \left(w - \frac{w}{2}\right) \right]$$

$$= \frac{1}{2} \frac{R_S}{L_1} i_L w$$

The equivalent resistance $R_L$ of a single leg of the transistor is $$R_L = \frac{V_L}{I_L} = \frac{1}{2} R_S \frac{w}{L_1}$$

or half the actual resistance of a single leg conduction all the current.

Now suppose that we have a given total current requirement $I_T$. The corresponding current per leg $I_L$ will be $$I_L = \frac{I_T}{N}$$

where N is the number of legs.

If we assume that the number of legs is fixed, what is the incremental change in resistance for an incremental change in width W? The effective resistance due to metal increases by an amount $$\Delta R = \frac{\frac{1}{2} R_S \frac{\Delta x}{L_1}}{N_L}$$

where $\Delta x$ is the increase in width.

Now consider the contribution of the channel resistance. Current per unit width will be $$\frac{I_0}{w} = \frac{K_p}{L_{eff}} [2(V_{gs} - V_T)V_{DS} - V_{DS}^2].$$

and the transconductance per unit width will be $$g_{dsw} = \frac{\partial I_w}{\partial V_{DS}}$$

$$= \frac{2K_P}{L_{EFF}} (V_{GS} - V_T)$$

Now we substitute some realistic device parameters into these expressions, for a worst case (at 100° C. and 4.4 V). Assume that the $K_p$ value is 18.5 $\mu A/V^2$ (which is reasonable for a worst-case PMOS device). Assume that $V_{TO} = 117$ mV;

$L_d = 0.1$ $\mu$m; (length reduction due to lateral diffusion: the effective length is equal to the drawn length $-2L_d$)

$x1 = 0.4$ $\mu$m; (width reduction)

Rsh = 87 $\Omega/\square$; (sheet resistance of the P+ diffusion)

$g_{ds} = 6.84$ mhos (for W/L = 20K/1.2); and $V_{TH} = -953$ mV.

Then $R_W = 29.2$ K $\Omega \cdot \mu$m.

Now consider: for a MOS decide of width W, what is the increment change in channel resistance with a change $\Delta X$ in width?

$$R_{CH} = \frac{R_{W'}}{W'}$$

where $R_{W'}$ is a constant of the process (and, for the process parameters above, is 29.2 k $\Omega \cdot \mu m$). Therefore, $$\frac{\partial R_{CH}}{\partial W'} = \frac{-R_{W'}}{W'^2}.$$

Now, consider the linear current density (in units of A/$\mu$m)

$$I_N = \frac{I_T}{NW'}$$

where $I_T$=Total Current, N=number of Legs, and W=Total Width per leg. The voltage drop across the Channel (at ideal $V_{DS}$) can accordingly be written as $$V_{CH} = R_{W'}I_N = \frac{R_{W'}I_T}{NW'}.$$

The contributions due to contact resistance and active resistance can be similarly considered. These contacts conduct a current $I_T$/NW', resulting in a voltage drop of $$V_{ACT+CONT} = (\tilde{R}_{ACT} + \tilde{R}_{CONT}) \cdot \frac{I_T}{NW'}$$

Combining the three components for voltage drop across the MOS device conducting current $I_T$:

$$V_{TOTAL} = V_{METAL} + V_{ACT+CONT} + V_{CH}$$

$$R_{EFF} = \frac{R_S}{L_1}\left(\frac{I_T}{N}\right) \cdot W' + (R_{ACT} + R_{CONT} + R_{W'})\left(\frac{I_T}{NW'}\right)$$

To minimize this voltage drop we differentiate with respect to W, and set the derivative to zero:

$$\frac{\partial V_{TOTAL}}{\partial W'} = \frac{R_S I_T}{L_1 N} - (R_{ACT} + R_{CONT} + R_{W'}) - \frac{I_T}{NW'^2}$$

$$\left[\frac{R_S}{L_1} - \frac{R_{ACT} + R_{CONT} + R_{W'}}{W'^2}\right]\frac{I_T}{N} = 0$$

$$W^2 \frac{R_S}{L_1} = R_{ACT} + R_{CON} + R_{W'}$$

Thus the optimal width $W_{OPT}$, at which minimum resistance will occur, is:

$$W_{OPT} = \sqrt{\frac{L_1 R_{ACT} + R_{CONT} + R_{W'}}{R_{S(METAL)}}}$$

For the process actually used in the presently preferred embodiment, these calculations lead to values approximately as follows:
$L_1 = 2.8 \ \mu m$
$R_{ACT} = 0.75 \ W \cdot 88 \ \Omega/\square$
$R_{CONT} = 25 \ \Omega$
$R_{W'} = 29.2 \ k \ \Omega/\mu m$
$R_S = 100 \ m \ \Omega/\square$

| PMOS PROCESS | 1.2 $\mu$m Temp | Linear Vgs | RON Rw | W Point of No Return |
|---|---|---|---|---|
| Worst | 100 | −4.4 | 29.2 k$\Omega \cdot \mu$m | 906 $\mu$m |
| Typical | 25 | −5.0 | 22.8 k$\Omega \cdot \mu$m | 798 $\mu$m |

Now suppose we have a requirement for a net total width $W_t$ and allowing the number of legs N and the metal width $L_1$ to be varied: How should a MOS device be constructed so as to minimize area: The area for an $N_L$-legged device of width $W_{OPT}$ will be $$AREA = N \cdot (L_1 + 2L_2 + L_3) W_{OPT}$$

where:
$L_1$, as noted above, represents the width of the metal stripe;
$L_2$ represents the offset between the edge of the metal stripe and the edge of the polysilicon gate (e.g. 0.3 microns, in the presently preferred embodiment); and
$L_3$ represents the width of the polysilicon gate (1.2 $\mu$m, in the presently preferred embodiment).[3]

[3] The specified spacings yield a resulting 2.2 $\mu$m (=1.2+1.2+1.2−0.7−0.7) metal spacing. In an alternative embodiment, metal overlap of contact may be extended to 0.9 $\mu$m to yield a smaller minimum metal spacing.

But note that $$N = \frac{W_{TOT}}{W_{OPT}}$$

Thus, to minimize area, $L_1$ (and $L_2$ and $L_3$) should all be kept as small as possible.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As noted above, the switching chip of the disclosed invention is particularly advantageous in combination with a power management chip. One particular way to exploit this advantage is to package a switching chip with a power management chip in a single module, such as a DIP or PLCC package which matches a standard integrated circuit footprint. This gives the manufacturers additional flexibility in providing enhanced versions of power management chips which have greatly enhanced switching capability.

As may be seen from the chip layout in FIG. 7, there are significant amounts of blank space remaining in the chip of the presently preferred embodiment. Thus, additional small-signal circuitry can readily be added if desired.

Some of the alternative embodiments will not include all the advantages of the presently preferred embodiment, but may still be useful for some applications. For example, in the presently preferred embodiment, note that only one of the large transistors is shunted with an N-channel transistor, to implement a transmission gate rather than a simple PMOS switch. A transmission gate can be advantageous in providing accurate low-resistance transfer of signals which are close to the power supply levels (or, in cases where the gates are pumped beyond the power supply levels, are close to the pumped gate levels). Thus, one use of a modified version of the chip of the presently preferred embodiment is for cutting communications links between different components of a system which may need to be powered down separately.

Other circuits could also be stuffed into the blank space which is available in the layout shown. For example, one could add a latch, possibly protected by a strobe relation, so that a micro could poll the power-on status of peripherals and then put itself to sleep without turning off all the peripherals.

In a further alternative embodiment, the chip described can even be used to switch power to a disk drive. Some of the newer disk drives, for notebook and laptop applications, are relatively low current and 5-Volt-only operation. These hard disks might be suitable for being power switched by the chip of the preferred embodiment. An example is the Seagate ST9025A which is rated at a power (Watts), in active/standby/idle modes, 3/1.6/0.5. The active current is then typically 600 mA, which can be switched by the chip of the presently preferred embodiment. The max spin up current is also tractable at 1 amp.

Note that the small area of digital circuitry shown in FIG. 7 can be seen to include some guardring structure around the edges thereof. The large switching transistors are inherently somewhat less susceptible to loss of state occurring from reverse bias conditions or to damage occurring from voltage transients, simply because these devices are so large that a significant amount of energy is needed to change their state. Of course, additional ESD protection structures can be added, either to the large transistors and/or to the digital circuitry, using a variety of the techniques well known to those skilled in the art.

Of course, if high electrical noise is expected or if the loads being switched may have significant inductance, and if high-speed switching is not necessary, then discrete capacitors can be tied to the pins of the chip for additional protection.

In a further alternative and less preferred embodiment, a bandgap voltage reference, with comparators, can be added on-chip for power-fail detection. Thus, such an alternative chip can be used, for example, as the master power switching chip for a whole system.

The presently preferred embodiment uses a CMOS process with a 1.2 micron minimum drawn gate length, and a minimum drawn gate width of 1.6 microns (although this minimum width is seldom used, since contact to the polysilicon requires a width of 2 microns). In this sample embodiment, five large switching transistors, each having equivalent dimensions of 90,000/1.2 microns, are provided on a chip which has a total area of only 16,200 square mils (about 10.5 mm²). Each of the transistors uses an active area (laid out in a compact folded configuration) of about 1460 square mils (about 90,000 square microns). The source and drain of each transistor are linked to contact pads by a large tapered metal run (as illustrated), and each of these metal runs (two per transistor) consumes about another 320 square mils. Thus, the active areas of the switching transistors occupy about 45% of the total chip area, and the transistors plus the area dedicated to their high-current connections consumes about 65% of the total chip area (about 2100 square mils per transistor). However, of course, if the die size is increased, the chip can be made to accommodate larger transistors, or more of them, or other digital or analog circuitry in addition to the transistors.

A further contemplated embodiment is the combination of a switching chip as described with a microprocessor management chip, such as the DS1236 chip available from Dallas Semiconductor Corp. Some specific advantageous examples are a combination of the described preferred switching chip embodiment with a DS1236 (or DS1238, or DS1239) MicroManager TM chip; or with a DS5340 (or other DS53xx) Softener TM chip; or with a DS1210 NVSRAM controller chip, with multiple SRAM chips. Modules including such combinations can be particularly advantageous. In fact, previous experience of configuring large NVSRAM modules has shown a risk in the use of multiple power controllers to provide necessary current capacity: in such a configuration, it is possible for the controllers to write protect various portions of the memory at different voltages. Thus, for example, in a 36 bit wide configuration, partial word writes might be possible. Thus, this combination of chips is particularly advantageous in protecting against such problems.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
 a plurality of n-channel field effect transistors, each having predominantly lateral current flow;
 a plurality of p-channel field effect transistors, each having predominantly lateral current flow, including four or more externally-accessible p-channel field effect switching transistors, each comprising a gate and first and second source/drain regions, and each respectively having an effective gate width of 30,000 microns or more, and
 each having an effective active area of more than 5% of the total area of said integrated circuit; and
 a plurality of wide metal leads, each operatively connected to link a respective source/drain terminal of one of said switching transistors to a corresponding external contact pad.

2. The integrated circuit of claim 1, wherein the minimum gate length of transistors of said integrated circuit is greater than 1 micron.

3. The integrated circuit of claim 1, wherein the minimum gate length of transistors of said integrated circuit is less than 1.5 micron.

4. The integrated circuit of claim 1, wherein the minimum gate length of transistors of said integrated circuit is approximately 1.2 micron.

5. The integrated circuit of claim 1, wherein the minimum gate width of transistors of said integrated circuit is greater than 1 micron.

6. The integrated circuit of claim 1, wherein the minimum gate length of transistors of said integrated circuit is less than 3 microns.

7. The integrated circuit of claim 1, wherein at least one said switching transistors is shunted by a respective N-channel transistor which is commonly controlled therewith to provide a transmission gate.

8. The integrated circuit of claim 1, wherein at least one said switching transistors is shunted by a respective protection diode.

9. The integrated circuit of claim 1, comprising five or more of said externally-accessible switching transistors.

10. The integrated circuit of claim 1, wherein each of said externally-accessible switching transistors has an effective gate width of 80,000 microns or more.

11. The integrated circuit of claim 1, wherein each of said externally-accessible switching transistors has an effective gate width which is more than 10,000 times the minimum gate width of any other transitor of said integrated circuit.

12. The integrated circuit of claim 1, wherein each of said externally-accessible switching transistors occupies an active area of 1000 square mils or more.

13. The integrated circuit of claim 1, wherein each of said externally-accessible switching transistors has an on-state conductance of more than 1.0 Siemens.

14. The integrated circuit of claim 1, wherein each of said externally-accessible switching transistors has an on-state conductance of at least about 1.5 Siemens.

15. The integrated circuit of claim 1, wherein each of said externally-accessible switching transistors has a drive current capability of more than 100 mA.

16. The integrated circuit of claim 1, wherein each of said externally-accessible switching transistors has a drive current capability of at least 300 mA.

17. The integrated circuit of claim 1, further comprising a charge-pumping circuit, connected to conditionally drive the gates of said switching transistors to a voltage more negative than ground.

18. The integrated circuit of claim 1, wherein multiple ones of said wide metal leads are tapered, from said source/drain terminal of said respective switching transistor, to provide a substantially minimum-length run to said respective contact pad.

19. The integrated circuit of claim 1, wherein more than one-third of the total area of the integrated circuit is devoted to active areas of said switching transistors.

20. The integrated circuit of claim 1, wherein all of said switching transistors together have a total gate width of more than 200,000 microns.

21. The integrated circuit of claim 1, wherein all of said switching transistors together have a total gate width of more than 400,000 microns.

22. The integrated circuit of claim 1, wherein all of said switching transistors together have a total gate width which is more than 300,000 times the minimum gate length for any other transitor of said integrated circuit.

23. The integrated circuit of claim 1, wherein all of said switching transistors together have a total gate width of more than 100,000 times the minimum gate width for any other transitor of said integrated circuit.

24. The integrated circuit of claim 1, wherein more than 5000 square mils of the area of the integrated circuit is devoted to active areas of said switching transistors.

25. The integrated circuit of claim 1, wherein more than one-half of the total area of the integrated circuit is devoted to said switching transistors, and to said wide metal leads and contact pads connected to said switching transistors.

26. The integrated circuit of claim 1, wherein more than 10,000 square mils of the total area of the integrated circuit is devoted to said switching transistors, and to said wide metal leads and contact pads connected to said switching transistors.

27. The integrated circuit of claim 1, wherein more than 2,000 square mils of the total area of the integrated circuit is devoted to each of said switching transistors, and to the pair of said wide metal leads and of said contact pads directly connected thereto.

28. The integrated circuit of claim 1, wherein more than one-half of the total area of the integrated circuit is devoted to said switching transistors, and to said wide metal leads and contact pads connected to said switching transistors.

29. An integrated circuit, comprising:
a plurality of n-channel field effect transistors, each having predominantly lateral current flow;
a plurality of p-channel field effect transistors, each having predominantly lateral current flow, including four or more externally-accessible p-channel field effect switching transistors, each comprising a gate and first and second source/drain regions, and each respectively having an effective gate width of 30,000 microns or more, and
each having an on-state conductance of more than 1.0 Siemens; and
a plurality of wide metal leads, each operatively connected to link a respective source/drain terminal of one of said switching transistors to a corresponding external contact pad.

30. The integrated circuit of claim 29, wherein the minimum gate length of transistors of said integrated circuit is less than 1.5 micron.

31. The integrated circuit of claim 29, wherein the minimum gate width of transistors of said integrated circuit, except said externally-accessible switching transistors, is less than 3 microns.

32. The integrated circuit of claim 29, wherein each of said externally-accessible switching transistors has an effective gate width of 80,000 microns or more.

33. The integrated circuit of claim 29, wherein each of said externally-accessible switching transistors occupies an active area of 1000 square mils or more.

34. The integrated circuit of claim 29, wherein each of said externally-accessible switching transistors has an on-state conductance of at least about 1.5 Siemens.

35. The integrated circuit of claim 29, wherein each of said externally-accessible switching transistors has a drive current capability of more than 100 mA.

36. The integrated circuit of claim 29, wherein each of said externally-accessible switching transistors has a drive current capability of at least 300 mA.

37. An integrated circuit, comprising:
a plurality of n-channel field effect transistors, each having predominantly lateral current flow;
a plurality of p-channel field effect transistors, each having predominantly lateral current flow, including four or more externally-accessible p-channel field effect switching transistors, each comprising a gate and first and second source/drain regions, and each respectively having an effective gate width of 50,000 microns or more; and
a plurality of wide metal leads, each operatively connected to link a respective source/drain terminal of one of said switching transistors to a corresponding external contact pad.

38. The integrated circuit of claim 37, wherein the minimum gate length of transistors of said integrated circuit is approximately 1.2 micron.

39. The integrated circuit of claim 37, wherein the minimum gate width of transistors of said intergrated circuit, except said externally-accessible switching transistors, is less than 3 microns.

40. The integrated circuit of claim 37, wherein multiple ones of said wide metal leads are tapered, from said source/drain terminal of said respective switching transistor, to provide a substantially minimum-length run to said respective contact pad.

41. The integrated circuit of claim 37, wherein each of said switching transistors has an effective gate width which is more than 50,000 times the minimum gate width of any other transistor of said integrated circuit.

42. An integrated circuit, comprising:
a plurality of n-channel field effect transistors, each having predominantly lateral on-state current flow;
a plurality of p-channel field effect transistors, each having predominantly lateral current flow, including a plurality of externally-accessible p-channel field effect switching transistors, each comprising a gate and first and second source/drain regions, and each respectively having an effective gate width which is more than 10,000 times the minimum gate width of any other transistor of said integrated circuit; and
a plurality of metal leads, each operatively connected to link a respective source/drain terminal of one of said switching transistors to a corresponding external contact pad;
wherein more than one-third of the total area of the integrated circuit is devote to active areas of said switching transistors.

43. The integrated circuit of claim 42, wherein each of said externally-accessible switching transistors occupies an active area of 1000 square mils or more.

44. The integrated circuit of claim 42, wherein each of said externally-accessible switching transistors occupies an active area which is more than 5% of the total area of said integrated circuit.

45. The integrated circuit of claim 42, further comprising a charge-pumping circuit, connected to conditionally drive the gates of said switching transistors to a voltage more negative than ground.

46. The integrated circuit of claim 42, wherein all of said switching transistors together have a total gate width which is more than 300,000 times the minimum gate length for transistors of said integrated circuit.

47. The integrated circuit of claim 42, wherein more than 2,000 square mils of the total area of the integrated circuit is devoted to each of said switching transistors, and to the pair of said wide metal leads and of said contact pads directly connected thereto.

48. The integrated circuit of claim 42, wherein said integrated circuit has a substantially rectangular shape, and each corner of said integrated circuit is occupied by one of said switching transistors.

49. An integrated circuit, comprising:
a plurality of n-channel field effect transistors, each having predominantly lateral on-state current flow;
a plurality of p-channel field effect transistors, each having predominantly lateral current flow, including a plurality of externally-accessible p-channel field effect switching transistors, each comprising a gate and first and second source/drain regions, and each respectively having an effective gate width which is more than 10,000 times the minimum gate width of any other transistor of said integrated circuit; and
a plurality of metal leads, each operatively connected to link a respective source/drain terminal of one of said switching transistors to a corresponding external contact pad;
wherein all of said switching transistors together have a total gate width of more than 200,000 microns;
and wherein all of said switching transistors together have a total drive current capablity of more than 1 Ampere.

50. The integrated circuit of claim 49, wherein the minimum gate length of transistor of said integrated circuit is less than 1.5 micron.

51. The integrated circuit of claim 49, wherein the minimum gate width of transistors of said integrated circuit is greater than 1 micron.

52. The integrated circuit of claim 49, wherein the minimum gate width of transistors of said integrated circuit, except said externally-accessible switching transistors, is less than 3 microns.

53. An integrated circuit, comprising:
a plurality of n-channel field effect transistors, each having predominantly lateral on-state current flow;
a plurality of p-channel field effect transistors, each having predominantly lateral current flow, including a plurality of externally-accessible p-channel field effect switching transistors, each comprising a gate and first and second source/drain regions, and each respectively having an effective gate width which is more than 10,000 times the minimum gate width of any other transistor of said integrated circuit; and
a plurality of metal leads, each operatively connected to link a respective source/drain terminal of one of said switching transistors to a corresponding external contact pad;
wherein all of said switching transistors together have a total gate width of more than 100,000 times the minimum gate width for any other transistor of said integrated circuit; and
wherein more than one-half of the total area of the integrated circuit is devoted to said switching transistors, and to said wide metal leads and contact pads connected to said switching transistors.

54. The integrated circuit of claim 53, wherein the minimum gate width of transistors of said integrated circuit is greater than 1 micron.

55. The integrated circuit of claim 53, wherein the minimum gate width of transistors of said integrated circuit, except said externally-accessible switching transistors, is less than 3 microns.

56. The integrated circuit of claim 53, wherein each of said externally-accessible switching transistors has an effective gate width of 80,000 microns or more.

57. An integrated circuit, comprising:
a plurality of n-channel field effect transistors, each having predominantly lateral on-state current flow;
a plurality of p-channel field effect transistors, each having predominantly lateral current flow, including a plurality of externally-accessible p-channel field effect switching transistors, each comprising a gate and first and second source/drain regions, and each respectively having an effective gate width which is more than 10,000 times the minimum gate width of any other transistor of said integrated circuit; and a plurality of metal leads, each operatively connected to link a respective source/drain terminal of one of said switching transistors to a corresponding external contact pad;

wherein the total gate width of the ten largest ones of said p-channel transistors is more than 100,000 times the minimum gate width for any other transistor of said integrated circuit.

58. The integrated circuit of claim 57, wherein the minimum gate width of transistors of said integrated circuit is greater than 1 micron.

59. The integrated circuit of claim 57, wherein the minimum gate width of transistors of said integrated circuit, except said externally-accessible switching transistors, is less than 3 microns.

60. The integrated circuit of claim 57, wherein the minimum gate width of transistors of said integrated circuit, except said externally-accessible switching transistors, is approximately 1.6 microns.

61. An integrated circuit, comprising:
a plurality of n-channel field effect transistors, each having predominantly lateral current flow;
a plurality of p-channel field effect transistors, each having predominantly lateral current flow, including at least four externally-accessible p-channel field effect switching transistors, each comprising a gate and first and second source/drain regions, and each respectively having an effective gate width which is more than 10,000 times the minimum gate width of any other transistor of said integrated circuit; and
each respectively having an effective gate width of 30,000 microns or more;
a plurality of wide metal leads, each operatively connected to link a respective source/drain terminal of one of said switching transistors to a corresponding external contact pad;
wherein said integrated circuit has a substantially rectangular shape, and each corner of said integrated circuit is occupied by one of said switching transistors.

62. The integrated cicuit of claim 61, wherein each of said externally-accessible switching transistors occupies an active area of 1000 square mils or more.

63. The integrated circuit of claim 61, wherein each of said externally-accessible switching transistors occupies an active area which is more than 5% of the total area of said integrated circuit.

64. The integrated circuit of claim 61, wherein each of said externally-accessible switching transistors has an on-state conductance of more than 1.0 Siemens.

65. The integrated circuit of claim 61, wherein each of said externally-accessible switching transistors has an on-state conductance of at least about 1.5 Siemens.

66. The integrated circuit of claim 61, wherein each of said externally-accessible switching transistors has a drive current capability of more than 100 mA.

67. The integrated circuit of claim 61, wherein each of said externally-accessible switching transistors has a drive current capability of at least 300 mA.

68. The integrated circuit of claim 61, further comprising a charge-pumping circuit, connected to conditionally drive the gates of said switching transistors to a voltage more negative than ground.

69. The integrated circuit of claim 61, wherein multiple ones of said wide metal leads are tapered, from said source/drain terminal of said respective switching transistor, to provide a substantially minimum-length run to said respective contact pad.

70. The integrated circuit of claim 61, wherein more than one-third of the total area of the integrated circuit is devoted to active areas of said switching transistors.

71. The integrated circuit of claim 61, wherein more than one-half of the total area of the integrated circuit is devoted to said switching transistors, and to said wide metal leads and contact pads connected to said switching transistors.

72. The integrated circuit of claim 61, wherein all of said switching transistors together have a total on-state conductance greater than 7.5 Siemens.

73. The integrated circuit of claim 61, wherein each of said externally-accessible switching transistors has a drive current capability of more than 100 mA.

74. The integrated circuit of claim 61, wherein each of said externally-accessible switching transistors has a drive current capability of at least 300 mA.

75. An integrated circuit, comprising:
a plurality of n-channel field effect transistors, each having predominantly lateral current flow;
a plurality of p-channel field effect transistors, each having predominantly lateral current flow;
a plurlaity of externally-accessible p-channel field effect switching transistors, each comprising a gate and first and second source/drain regions, and each respectively having an effective gate width which is more than 10,000 times the minimum gate width of any other transistor of said integrated circuit; and each having predominantly lateral on-current flow; and
a plurality of wide metal leads, each operatively connected to link a respective source/drain terminal of one of said switching transistors to a corresponding external contact pad;
wherein multiple ones of said wide metal leads are tapered, from said source/drain terminal, to provide a substantially minimum-length run to said contact pad.

76. The integrated circuit of claim 75, wherein the minimum gate length of transistors of said integrated circuit is less than 1.5 micron.

77. The integrated circuit of claim 75, wherein at least one said switching transistors is shunted by a respective protection diode.

78. The integrated circuit of claim 75, comprising five or more of said externally-accessible switching transistors.

79. The integrated circuit of claim 75, wherein each of said externally-accessible switching transistors has an effective gate width of 30,000 microns or more.

80. The integrated circuit of claim 75, wherein each of said externally-accessible switching transistors has an effective gate width of 80,000 microns or more.

81. The integrated circuit of claim 75, wherein each of said externally-accessible switching transistors occupies an active area of 1000 square mils or more.

82. The integrated circuit of claim 75, wherein each of said externally-accessible switching transistors has an on-state conductance of more than 1.0 Siemens.

83. The integrated circuit of claim 75, wherein each of said externally-accessible switching transistors has an on-state conductance of at least about 1.5 Siemens.

84. The integrated circuit of claim 75, wherein each of said externally-accessible switching transistors has a drive current capability of more than 100 mA.

85. The integrated circuit of claim 75, wherein each of said externally-accessible switching transistors has a drive current capability of at least 300 mA.

86. The integrated circuit of claim 75, wherein more than 2,000 square mils of the total area of the integrated circuit is devoted to each of said switching transistors, and to the pair of said wide metal leads and of said contact pads directly connected thereto.

87. The integrated circuit of claim 75, wherein more than one-half of the total area of the integrated circuit is devoted to said switching transistors, and to said wide metal leads and contact pads connected to said switching transistors.

88. The integrated circuit of claim 75, wherein said integrated circuit has a substantially retangular shape, and each corner of said integrated circuit is occupied by one of said switching transistors.

89. An integrated circuit, comprising:
a plurality of n-channel field effect transistors, each having predominantly lateral current flow;
a plurality of p-channel field effect transistors, each having predominantly lateral current flow;
a plurality of externally-accessible p-channel field effect switching transistors, each having predominantly lateral on-current flow, and each comprising a gate and first and second source/drain regions, and each respectively having an effective gate width which is more than 10,000 times the minimum gate width of any other transistors of said integrated circuit; and
a plurality of wide metal leads, each operatively connected to link a respective source/drain terminal of one of said switching transistors to a corresponding external contact pad;
a charge-pumping circuit, connected to conditionally drive the gates of said switching transistors to a voltage more negative than ground.

90. The integrated circuit of claim 89, wherein at least one said switching transistors is shunted by a respective N-channel transistor which is commonly controlled therewith to provide a transmission gate.

91. The integrated circuit of claim 89, wherein said charge-pumping circuit conditionally applies a voltage which is more than one Volt below ground.

92. The integrated circuit of claim 89, wherein at least one said switching transistors is shunted by a respective protection diode.

93. The integrated circuit of claim 89, comprising three or more of said externally-accessible switching transistors.

94. The integrated circuit of claim 89, wherein each of said externally-accessible switching transistors has an effective gate width of 50,000 microns or more.

95. The integrated circuit of claim 89, wherein each of said externally-accessible switching transistors has an effective gate width which is more than 10,000 times the minimum gate width of any other transistor of said integrated circuit.

96. The integrated circuit of claim 89, wherein each of said externally-accessible switching transistors occupies an active area of 1000 square mils or more.

97. The integrated circuit of claim 89, wherein all of said switching transistors together have a total gate width of more than 200,000 microns.

98. The integrated circuit of claim 89, wherein all of said switching transistors together have a total gate width of more than 400,000 microns.

99. An integrated circuit, comprising:
a plurality of n-channel field effect transistors, each having predominantly lateral current flow, and a plurality of p-channel field effect transistors, each having predominantly lateral current flow; said transistors having a minimum length which is less than 2 microns, and a minimum width which is less than 3 microns;
four or more externally-accessible p-channel field effect switching transistors, each comprising a gate and first and second source/drain regions, and each having predominantly lateral on-state current flow, and
each respectively having an effective gate width which is more than 80,000 microns, which is more than 10,000 times the minimum gate width of any other transistors of said integrated circuit; and
each occupying an active area which is greater than 1000 square mils, and which is more than 5% of the total area of said integrated circuit; and
each having an on-state conductance of at least about 1.5 Siemens;
each having a drive current capability of at least about 300 mA;
a plurality of wide metal leads, each operatively connected to link a respective source/drain terminal of one of said switching transistors to a corresponding external contact pad; each of said leads being tapered, from said source/drain terminal, to provide a substantially minimum-length run to said contact pad;
a charge-pumping circuit, connected to conditionally drive the gates of said switching transistors to a voltage more negative than ground;
wherein more than one-third of the total area of the integrated circuit is devoted to active areas of said switching transistors, and more than one-half of the total area of the integrated circuit is devoted to said switching transistors with said wide metal leads and contact pads connected to said switching transistors;
wherein all of said switching transistors together have a total gate width which is greater than 400,000 microns, and more than 300,000 times the minimum gate length for transistors of said integrated circuit, and more than 100,000 times the minimum gate width for any other transistor of said integrated circuit; and
wherein all of said switching transistors together have a total drive current capability of more than 1.5 Ampere at a voltage drop of 200 mV;
wherein said integrated circuit has a substantially rectangular shape, and each corner of said integrated circuit is occupied by one of said switching transistors.

100. A system comprising, in combination,
a switching integrated circuit as claimed in claim 1, and
a second integrated circuit
which contains an on-chip bandgap-voltage-reference circuit
and which is connected to detect failure of a system power supply and which is connected to turn off one or more of said switching transistors of said switching integrated circuit upon failure of the system power supply is detected; and one or more other integrated circuits which are connected to be powered solely through one or more of said switching transistors of said switching integrated circuit.

* * * * *